(12) United States Patent
Michalak et al.

(10) Patent No.: US 9,269,652 B2
(45) Date of Patent: Feb. 23, 2016

(54) CHEMICALLY ALTERED CARBOSILANES FOR PORE SEALING APPLICATIONS

(75) Inventors: David J. Michalak, Portland, OR (US); James M. Blackwell, Portland, OR (US); Jeffery D. Bielefeld, Forest Grove, OR (US); James S. Clarke, Portland, OR (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 13/995,905

(22) PCT Filed: Dec. 22, 2011

(86) PCT No.: PCT/US2011/066977
§ 371 (c)(1),
(2), (4) Date: Jun. 19, 2013

(87) PCT Pub. No.: WO2013/095539
PCT Pub. Date: Jun. 27, 2013

(65) Prior Publication Data
US 2013/0320520 A1    Dec. 5, 2013

(51) Int. Cl.
*H01L 21/76*    (2006.01)
*H01L 23/485*    (2006.01)
*H01L 21/3105*    (2006.01)
(Continued)

(52) U.S. Cl.
CPC .......... *H01L 23/485* (2013.01); *H01L 21/3105* (2013.01); *H01L 21/76814* (2013.01); *H01L 21/76826* (2013.01); *H01L 21/76831* (2013.01); *H01L 21/02203* (2013.01); *H01L 21/02343* (2013.01); *H01L 21/02359* (2013.01); *H01L 2924/0002* (2013.01)

(58) Field of Classification Search
None
See application file for complete search history.

(56) References Cited

U.S. PATENT DOCUMENTS

2005/0266698 A1* 12/2005 Cooney ............. H01L 21/02107
438/765
2006/0183055 A1    8/2006 O'Neill et al.
(Continued)

FOREIGN PATENT DOCUMENTS

TW          200845212        11/2008
WO     WO-2007047822         4/2007

OTHER PUBLICATIONS

Intel Corporation, IPRP mailed Jul. 3, 2014 for PCT/US2011/066977.
Chojnowski, J., et al., "Synthesis of highly branched alkoxysiloxane-Dimethylsiloxane copolymers by nonhydrolytic dehydrocarbon polycondensation catalyzed by tris (pentafluorophenyl)borane", Macromolecules, American Chemical Society, 41, (2008), 7352-7358.
(Continued)

*Primary Examiner* — Benjamin Sandvik
*Assistant Examiner* — Herve Assouman
(74) *Attorney, Agent, or Firm* — Blakely, Sokoloff, Taylor & Zafman LLP

(57) ABSTRACT

A method including forming a dielectric material including a surface porosity on a circuit substrate including a plurality of devices; chemically modifying a portion of the surface of the dielectric material with a first reactant; reacting the chemically modified portion of the surface with a molecule that, once reacted, will be thermally stable; and forming a film including the molecule. An apparatus including a circuit substrate including a plurality of devices; a plurality of interconnect lines disposed in a plurality of layers coupled to the plurality of devices; and a plurality of dielectric layers disposed between the plurality of interconnect lines, wherein at least one of the dielectric layers comprises a porous material surface relative to the plurality of devices and the surface comprises a pore obstructing material.

18 Claims, 4 Drawing Sheets

(51) Int. Cl.
*H01L 21/768* (2006.01)
*H01L 21/02* (2006.01)

(56) References Cited

U.S. PATENT DOCUMENTS

| | | | |
|---|---|---|---|
| 2008/0199977 A1 | 8/2008 | Weigel et al. | |
| 2008/0254232 A1* | 10/2008 | Gordon | C07C 211/65 427/585 |
| 2009/0115031 A1* | 5/2009 | Farkas | C23C 18/122 257/650 |

OTHER PUBLICATIONS

Intel Corporation, et al., PCT International Search Report and Written Opinion mailed Sep. 26, 2012 for PCT/US2011/066977.

Thompson, D. B., et al., "Rapid Assembly of Complex 3D Siloxane Architetures", J. Am. Chem. Soc., 130, (2008), 32-33.

Intel Corporation, et al., Taiwan Office Action mailed Oct. 15, 2014 for TW Patent Application No. 101143075.

Intel Corporation, "First office action", Taiwan Appln. No. 101143075, (Jun. 10, 2015).

* cited by examiner

CHEMICALLY ALTERED CARBOSILANES FOR PORE SEALING APPLICATIONS

CROSS-REFERENCE TO RELATED APPLICATION

This patent application is a U.S. National Phase Application under 35 U.S.C. §371 of International Application No. PCT/US2011/066977, filed Dec. 22, 2011, entitled CHEMICALLY ALTERED CARBOSILANES FOR PORE SEALING APPLICATIONS.

BACKGROUND

1. Field

Integrated circuit processing.

2. Description of Related Art

Modern integrated circuits use conductive interconnections to connect the individual devices on a chip or to send and/or receive signals external to the device(s). Common types of interconnections include copper and copper alloy interconnections (lines) connected to individual devices, including other interconnections (lines) by interconnections through vias.

One method of forming an interconnection, particularly a copper interconnection, is a damascene process. A typical damascene process involves forming a via and an overlying trench in a dielectric to an underlying circuit device, such as a transistor or an interconnection. The via and trench are then lined with a barrier layer of a refractory material, such as titanium nitride (TiN), tungsten nitride (WN), tantalum (Ta), or tantalum nitride (TaN). The barrier layer serves, in one aspect, to inhibit the diffusion of the interconnection material that will subsequently be introduced in the via and trench into the dielectric. Next, an adhesion layer may be formed on the barrier layer to improve the adhesion of a subsequently formed conductive interconnection to the barrier layer or the via and/or trench. Suitable materials for an adhesion layer include titanium (Ti), tantalum (Ta) and ruthenium (Ru). Next, a suitable seed material is deposited on the walls of the via and trench. Suitable seed materials for the deposition of copper interconnection material include copper (Cu), nickel (Ni), cobalt (Co), and ruthenium (Ru). Next, interconnection material, such as copper, is introduced by electroplating in a sufficient amount to fill the via and trench and complete the interconnect structure. Once introduced, the interconnection structure may be planarized and a dielectric material (including an interlayer dielectric material) introduced over the interconnection structure to suitably isolate the structure.

In prior art integrated circuit structures, a common dielectric material for use to form dielectric layers between the device and between interconnection lines was silicon dioxide ($SiO_2$). More recent efforts are focused at minimizing the effective dielectric constant of an interlayer dielectric (ILD) so materials having a dielectric constant lower than $SiO_2$ have gathered significance consideration. Many of these materials such as carbon doped oxide (CDO) are porous.

In order to target low dielectric constants, ILD film porosity is typically targeting excess of 30 percent by volume. Unfortunately, the highly porous materials are susceptible to penetration of metals during interconnect formation and the presence of metals within an ILD is expected to cause increased rates of failure (e.g., dielectric breakdown, high leakage).

Current methods to inhibit penetration of metal into a porous ILD include efforts to seal the surface of the pores prior to metallization. Unfortunately, these methods are not able to cover sufficiently large pore sizes, are not able to withstand necessary thermal processing, or tend to increase the total dielectric constant of the ILD.

DETAILED DESCRIPTION

Figure 1:
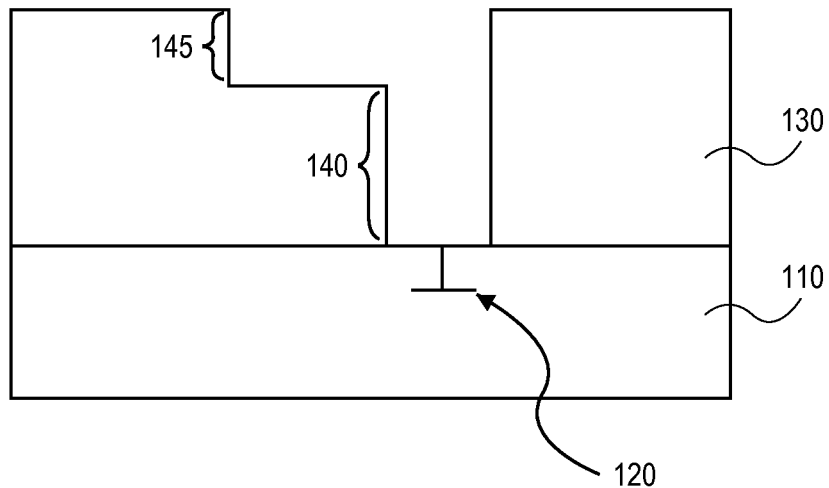
FIG. 1 shows a cross-sectional, schematic side view of a portion of an integrated circuit structure and shows a via and a trench formed in a dielectric material to a contact point.

FIG. 1 shows a cross-sectional, schematic side view of a portion of an integrated circuit structure. Structure 100 includes substrate 110 of, for example, a semiconductor material which is silicon (i.e., a silicon wafer) or a semiconductor layer on an insulator such as glass. Substrate 110 includes contact point 120 at a surface thereof. In one embodiment, contact point 120 is a device on or in a substrate 110 (e.g., a gate or junction of a transistor, etc.) or a portion of an interconnect layer or line (e.g., a contact point on a metal trench). A typical integrated circuit such as a microprocessor chip may have, for example, multiple interconnecting layers or levels separated from one another by interlayer dielectric (ILD) material (from the substrate ILD 0, ILD 1 . . . ILD 5). It is appreciated that the techniques described herein may be used for various layers or levels.

Overlying a superior surface of substrate 110 (as viewed) in FIG. 1 is dielectric material 130. In one embodiment, dielectric material 130 is a dielectric material having a dielectric constant less than the dielectric constant of silicon dioxide ($k_{SiO2}$=3.9), a "low k dielectric." A suitable material for dielectric material 130 is a porous material with, for example, a porosity targeted in excess of 30 percent by volume. Suitable material includes carbon doped oxide (CDO) or carbon, silicon, and oxygen containing material, but may alternatively have a compositions of silicon dioxide, fluorine-doped oxide, carbosilane, oxycarbosilane, silicon carbide, silicon nitride, silicon oxynitride, fluorocarbon (CFx), or hydrocarbon (CHx).

FIG. 1 shows via 140 through dielectric material 130 to expose contact point 120 (a contact point on a device substrate or an underlying interconnect line such as an underlying trench). FIG. 1 also shows trench 145 formed in a portion of dielectric material 130 over via 140. A trench and a via may be formed according to known techniques by, for example, initially using a mask, such as a photoresist mask, to define an area (e.g., a cross-sectional area) for a via opening and etching the via with a suitable chemistry. The mask may then be removed (e.g., by an oxygen plasma or wet chemical clean to remove photoresist) and a second mask patterned to define, for example, a greater area (e.g., a greater cross-sectional area) for a trench opening. A subsequent mask and etch is introduced to form trench 145 and then the second mask is removed leaving the substrate shown in FIG. 1. Alternatively, the formation of trench and a via may be reversed (i.e., trench first processing).

As noted above, one concern with using a porous dielectric material, such as a porous carbon, silicon, oxygen-based (CDO) material, is a potential for infiltration of metal species into the dielectric material (e.g., into pores of the dielectric material) during, for example, interconnect processing. In one embodiment, a method is described to reduce a surface porosity of a porous dielectric material by reacting a surface of the material with a material that alone or in a cross-linked network or matrix obstructs the pores in the surface of the material. By obstructing the pores is meant that a pore is covered either completely or covered substantially enough such that a metal species from an interconnection deposition cannot significantly infiltrate the pore. In one embodiment pore obstructing material is a thermally stable molecule that is capable of cross-linking or polymerizing with similar molecules to form a skin or film over or across at least a portion of a pore.

Figure 2:
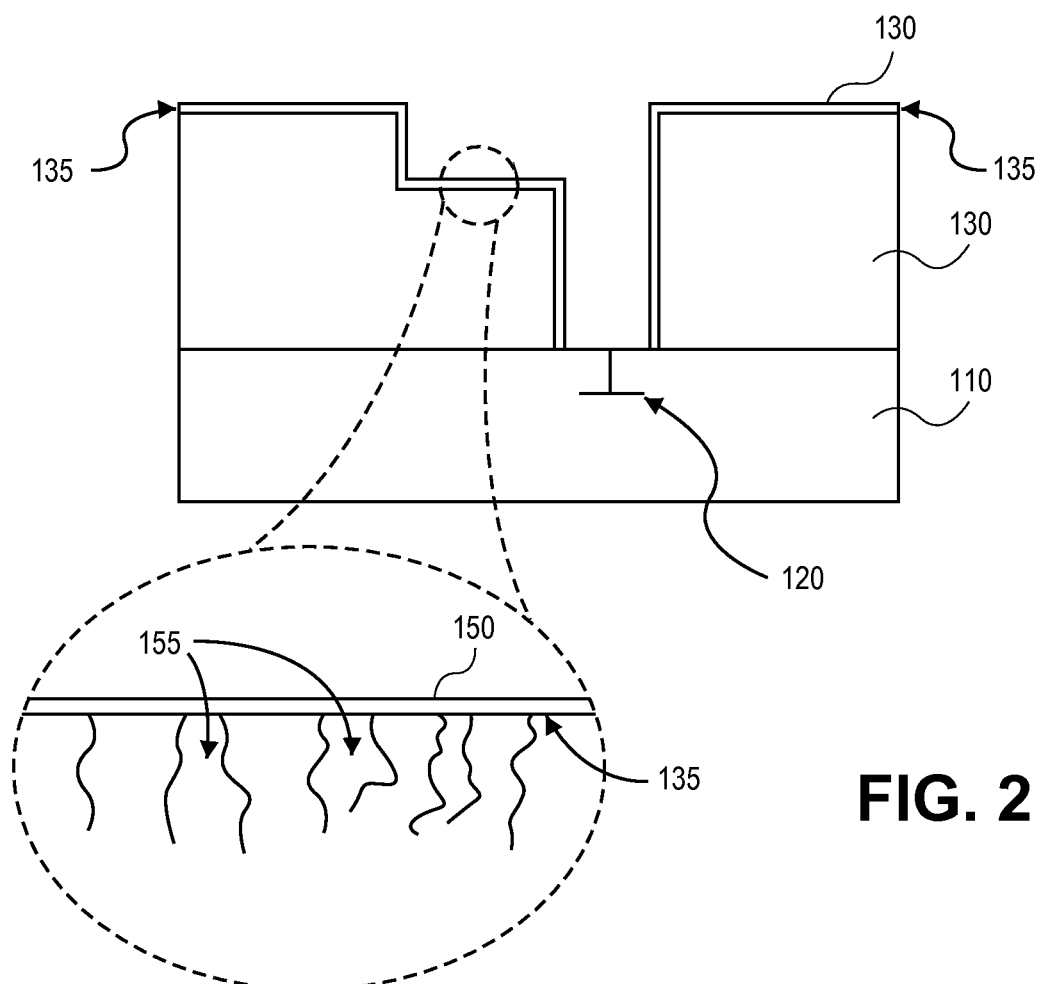
FIG. 2 shows the structure of FIG. 1 following the introduction of a film or skin of a pore obstructing material on a surface of the dielectric material layer.

FIG. 2 shows the structure of FIG. 1 following the introduction of a pore obstructing material on a surface of dielectric material layer 130. In one embodiment, pore obstructing material 150 is a carbosilane molecule that reacts with a surface of the layer of dielectric material 130 and cross-links or polymerizes with other molecules to form a film or skin that blocks a pore or pores on a surface of the layer of dielectric material 130 from infiltration by species (e.g., metal species) that without the presence of pore obstructing material 150 might otherwise be capable of infiltrating a pore or pores. Referring to the inset of FIG. 2, in one embodiment, pore obstructing material 150 such as a carbosilane is selectively deposited by, for example, spinning, vapor depositing, or molecular layer deposition (MLD) techniques on the surface of a layer of dielectric material 130, particularly in areas where subsequent metal deposition is to occur. The inset shows pore obstructing material 150 formed on the surface of the layer of dielectric material 130 in a manner that, in this view, it overlies pores 155 (i.e., it blocks access to pores 155). FIG. 2 shows pore obstructing material 150 formed as a film or skin over the entire surface of a layer of dielectric material 130 including exposed surfaces in via 140 and trench 145. It is appreciated that such film or skin need not be formed on the entire surface but may be limited to that area where metal infiltration is anticipated, such as pores associated with trench 145 and via 140 that are to be filled with a metal material such as copper or a copper alloy.

In one embodiment, a porous dielectric material such as dielectric material 130 of carbon, silicon and oxygen material has a tendency to be hydrophobic or not readily capable of reacting with a pore obstructing material such as a carbosilane. Accordingly, in one embodiment, a surface of a dielectric layer such as the surface of dielectric material 130 is initially modified or altered in areas where a pore obstructing material film or skin is desired to encourage a reaction through a chemical bond (e.g., covalent bond) of a pore obstructing material thereto. Representatively, such modification or altering may be a chemical modification where the surface of the dielectric layer is modified or altered to contain surface silanol (Si—OH) groups. One way this is accomplished is by using a light plasma treatment (e.g., a hydrogen or oxygen plasma) in areas where it is desired to form a pore obstructing material film or skin. Silanol groups will modify or alter the surface of the dielectric material rendering the dielectric material more hydrophilic in areas containing the silanol groups while the remainder of the dielectric material is hydrophobic.

Figure 3:
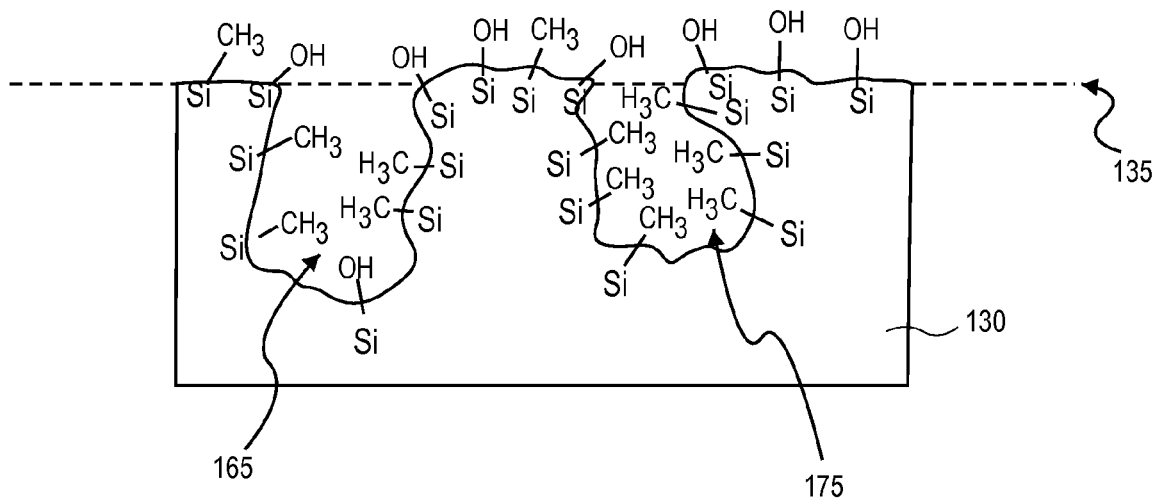
FIG. 3 shows a magnified side view of a portion of a surface of the dielectric material of FIG. 1 prior to the introduction of a film or skin of a pore obstructing material and illustrates pores in a surface of the dielectric material and the surface having been modified or altered to include silanol groups.

FIG. 3 shows a magnified side view of a portion of a surface of dielectric material 130 and illustrates, representatively, pore 165 and pore 175 in a surface of the dielectric material. FIG. 3 shows surface 135 of dielectric material 130 following the modification of the surface to form surface silanol groups in the material. As illustrated, in one embodiment, it is desired that the silanol groups are formed on a superior surface (as viewed) of the dielectric material and not within pore 165 or pore 175. In this manner, pore obstructing material will be less likely to form in the pores ("pore stuffing") and a porosity of dielectric material 130 will not be reduced or will be only minimally reduced and not significantly reduced. Such effort to confine the silanol to a surface 135 may be accomplished by controlling a plasma or other treatments.

Once surface 135 of dielectric material 130 is modified or altered to include surface silanols, surface 135 may be reacted with a pore obstructing material. In one embodiment, a pore obstructing material is a thermally stable carbosilane. In terms of thermally stability, it is desired that the carbosilane is a stable at temperatures on the order of 400° C. for 30 minutes or longer. It is appreciated that in forming integrated circuit structures such as microprocessor chips, processing operations used in formation may expose the structure to elevated temperatures such as temperatures on the order of 400° C. Accordingly, in order to produce a pore obstructing material film or skin that is stable and will inhibit penetration of metal species into pores of dielectric material 130 during processing, the pore obstructing material should be thermally stable at temperatures to which the structure may be exposed.

In one embodiment, the pore obstructing material is a carbosilane that will result in a thermally stable film. Suitable carbosilanes include chlorosilanes, aminosilanes, silane terminated carbosilanes (e.g., hydridosilanes), and alkoxy terminated carbosilanes. Suitable carbosilane include linear or branched monomers or oligomers and ring monomers or oligomers. Representative ringed carbosilanes include molecules including at least one ring structure of carbon and silicon atoms.

Suitable carbosilanes may be deposited by various methods including spinning, vapor deposition and molecular layer deposition. In one embodiment, it is desired that the presence of pore obstructing material in the pores be minimized to prevent "porous stuffing." One way to minimize porous stuffing as described above is by limiting a surface modification or alteration to promote pore obstructing material bonding. Another way is by the deposition method of the pore obstructing material. Larger molecules that will not have a tendency to infiltrate pores of the dielectric material can be delivered using a spin on method. Smaller molecules that may be capable of infiltrating pores of the dielectric material can be deposited using vapor deposition or molecular layer deposition to limit pore stuffing.

Representative of suitable carbosilanes include the following:

Chlorosilanes:

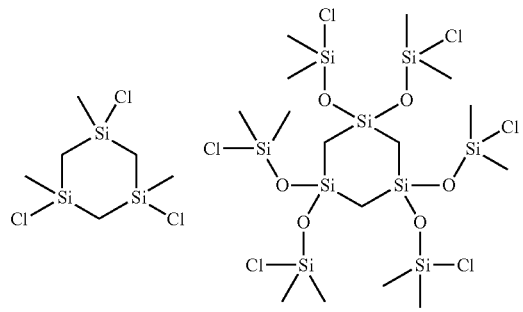

-continued
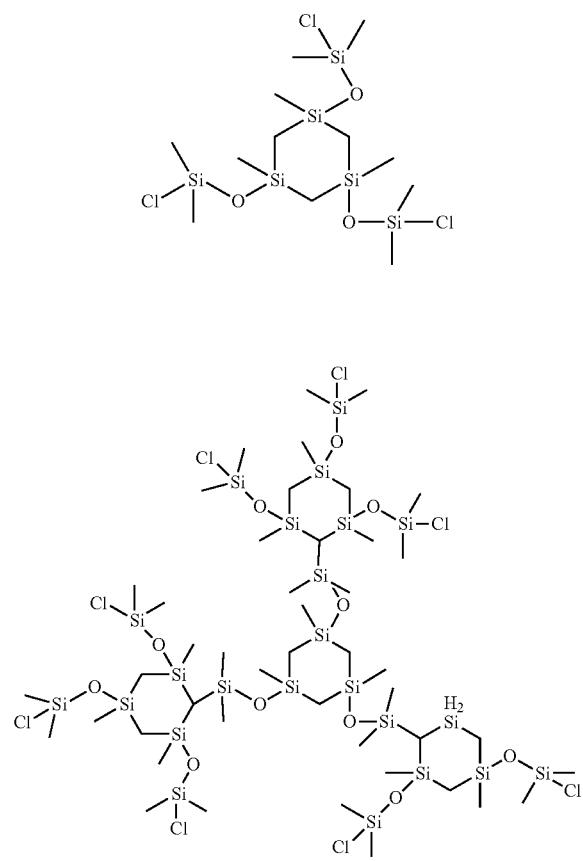
Alkoxy Terminated Silanes:
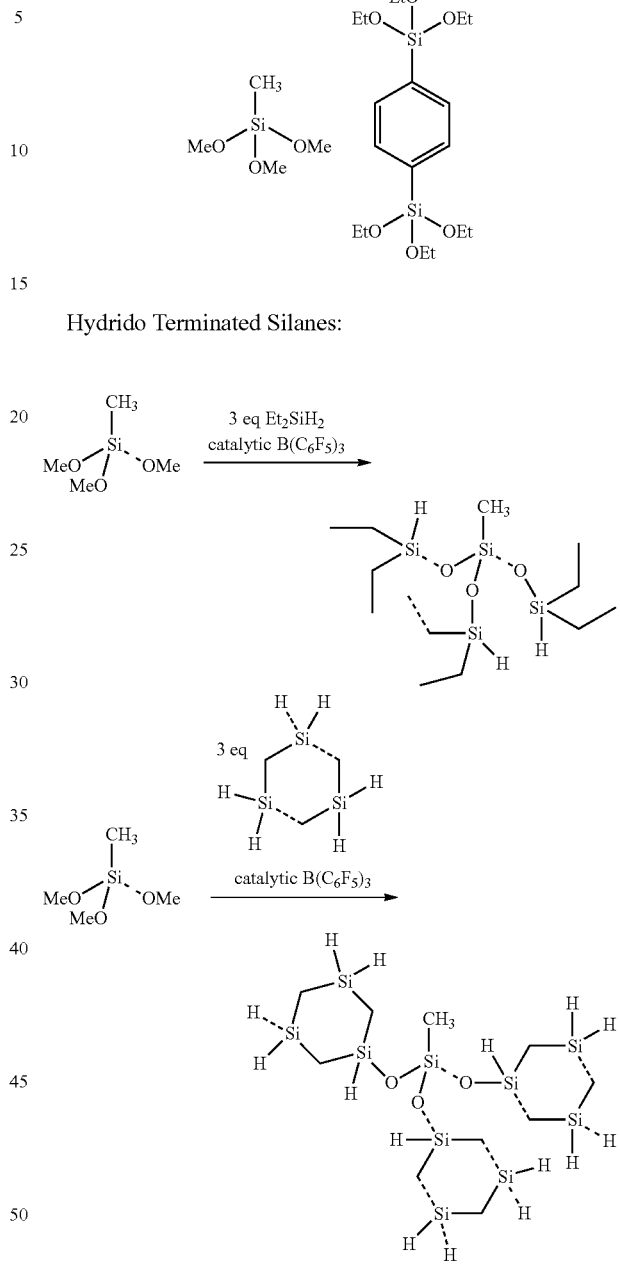
Hydrido Terminated Silanes:
Aminosilanes:
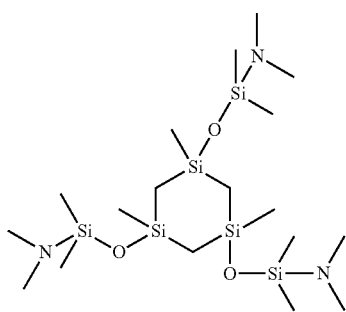
Chlorosilanes readily hydrolyze or react with silanol groups. The reaction proceeds as follows:
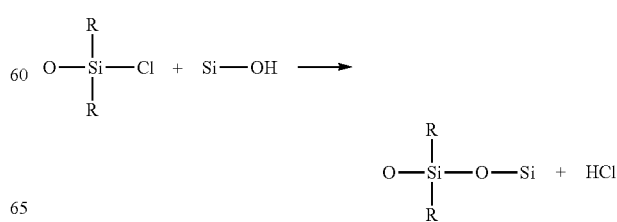

The aminosilane also readily hydrolyzes or reacts with silanol groups. An illustration of this reaction is as follows:

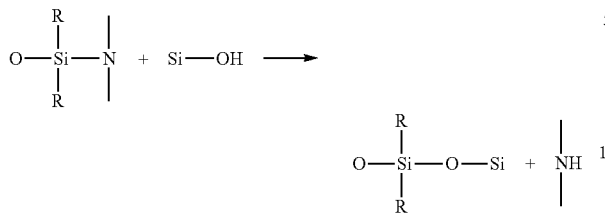

The Si—H groups of the hydrido silane may react with silanol groups at moderate or elevated temperatures, may be acid or base catalyzed, or may be facilitated by a Lewis Acid catalyst, such as tris pentafluorophenyl boron, $B(C_6F_5)_3$.

Once the carbosilane molecules (e.g., chlorosilane, aminosilane) are bound to the dielectric material (e.g., through reaction with surface silanols), the molecules are strongly attracted to one another and, in the presence of water, the carbosilane molecules condense into a polymer to form a film or skin on the surface of the dielectric material. An amount of carbosilane molecules in addition to that amount needed to react with surface silanols may also be introduced on a surface of a porous dielectric material to form a desired skin or film (e.g., skin or film 150 on surface 135 of dielectric material 130, see FIG. 2. For the case of a hydrido terminated silane, it is possible that the water could be substituted with an ether (e.g., diethyl ether (Et2O)), a siloxane (e.g., tetraethylorthosilicate (TEOS)) or an alkoxy terminated carbosilane, in the presence of a Lewis acid catalyst such as trispentafluorophenyl boron to facilitate condensation of the carbosilane molecules into a polymer.

As noted above, various methods for introducing the carbosilane may be utilized. These methods include introduction of the carbosilane by spinning, vapor deposition or molecular layer deposition. A representative molecular layer deposition involving a chlorosilane proceeds as follows. Initially, chlorosilane monomer molecules are reacted with the surface of the dielectric layer (e.g., with surface silanols—releasing HCl). Once reacted, water is added to convert any remaining Si—Cl bonds of the covalently bond monomers to Si—OH groups (releasing HCl). The Si—OH groups of the bound carbosilane molecules are now reaction sites for other chlorosilane molecules including adjacent bound molecules and subsequently introduced molecules. Two neighboring Si—OH sites may alternatively condense via a sol-gel mechanism to form a crosslinking Si—O—Si bond and release $H_2O$. Alternating subsequent doses of carbosilane molecule and water will build a polymer and/or multilayer that can bridge open pores in a porous dielectric material. The molecular layer deposition approach provides the ability to bridge pores of arbitrary size with a covalently bonded, thermally stable carbosilane film.

Following the formation of a porous obstructing material film or skin 150 on desired areas of surface 135 of dielectric material 130, further processing of the integrated circuit structure may proceed. Representatively, a barrier layer, adhesion layer and a seed layer may be introduced to via 140 and trench 145 followed by deposition of a conductive interconnection material such as copper metal or a copper alloy (e.g., copper-tin (CuSn), copper-aluminum (CuAl), copper-indium (CuIn), etc.). A metal may be introduced by deposition (e.g., see chemical vapor deposition) or electroplated.

Figure 4:
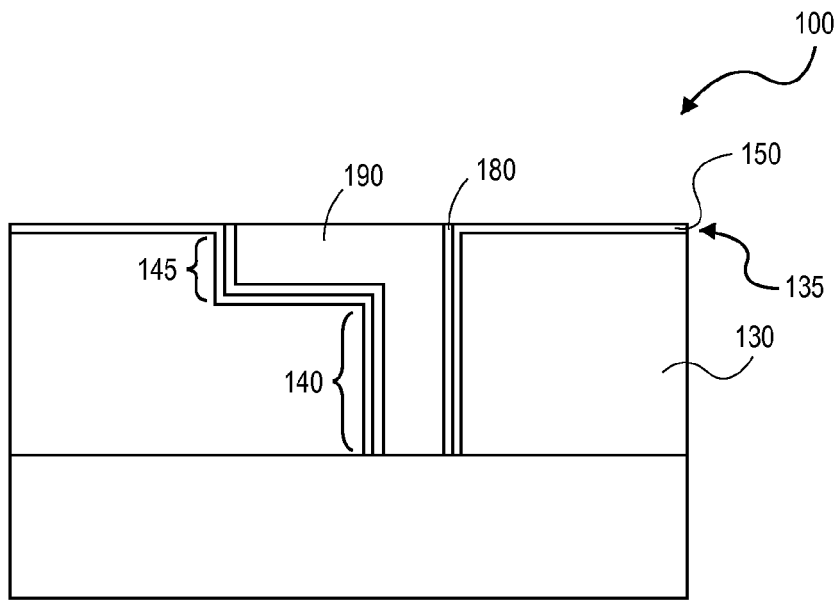
FIG. 4 shows structure of FIG. 2 following the formation of an interconnect structure in the via and the trench.

FIG. 4 shows structure 100 following the introduction of layer 180 along the side walls of via 140 and trench 145. Layer 180 may be a composite layer of a barrier layer of, for example, tantalum nitride (TaN), tantalum silicon nitride (TaSiN), titanium nitride (TiN); an adhesion layer of titanium (Ti), tantalum (Ta) or ruthenium (Ru); and a seed layer of copper. Conductive material 190, for example, copper or copper alloy is then introduced in via 140 and trench 145 (e.g., via electroplating). Once conductive material 190 is introduced into via 140 and trench 145, a top surface of structure 100 (as viewed) may be planarized and, if desired, additional dielectric and interconnect layers may be introduced (e.g., a typical microprocessor may have up to 10 layers or lines of interconnects electrically isolated by dielectric material).

Figure 5:
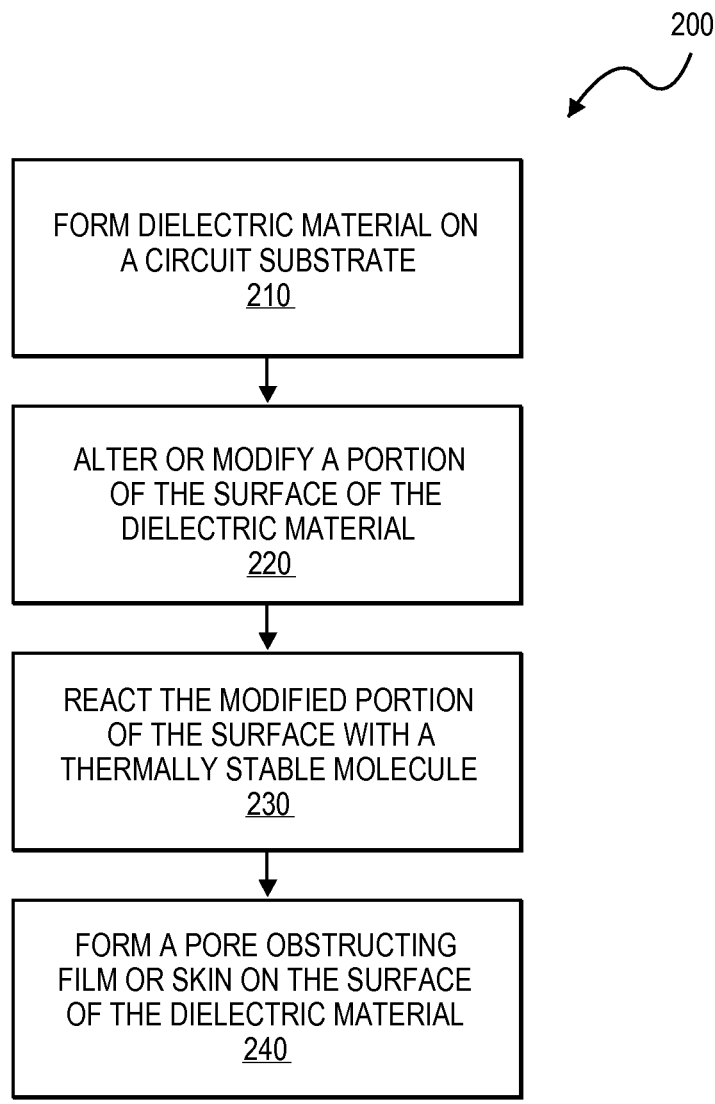
FIG. 5 shows a flow chart of a method of forming a film or skin of a pore obstructing material.

FIG. 5 shows a flow chart describing a method for modifying a surface of a porous dielectric. In method 200, initially a dielectric material is formed on a circuit substrate (block 210) the dielectric material may be an interlayer dielectric (ILD) formed on a substrate or between interconnect lines. Additional processing may include a formation of one or more vias and trenches in the dielectric material.

Once a dielectric material is formed on a circuit substrate, a portion of a surface of the dielectric material may be altered or modified to render the surface reactive to another material (block 220). In one embodiment, a dielectric material may be altered or modified by introducing surface silanols in desired areas, such as areas on a surface but not in pores on the surface.

Once an area of a surface of a dielectric material is modified, method 200 describes reacting the modified portion of the surface with a thermally stable molecule (block 230). As noted above, one class of suitable thermally stable molecules are carbosilane that are stable at temperatures on the order of 400° C. for at least 30 minutes. A carbosilane will react with the modified or altered surface of the dielectric (e.g., react with surface silanols) and form covalent bonds therewith. Following the reaction with the surface, the carbosilane molecules may crosslink and polymerize with other covalently bonded molecules, or additional molecules added thereto. The crosslinked, or polymerized material forms a pore obstructing film or skin on the surface of the dielectric material (block 240). It is appreciated that the pore obstructing film or skin need not be continuous across a surface of a dielectric material or even a desired area of a surface of a dielectric material. It is sufficient that the pore obstructing film or skin sufficiently obstruct pores in a desired area from infiltration by, for example, metal.

Figure 6:
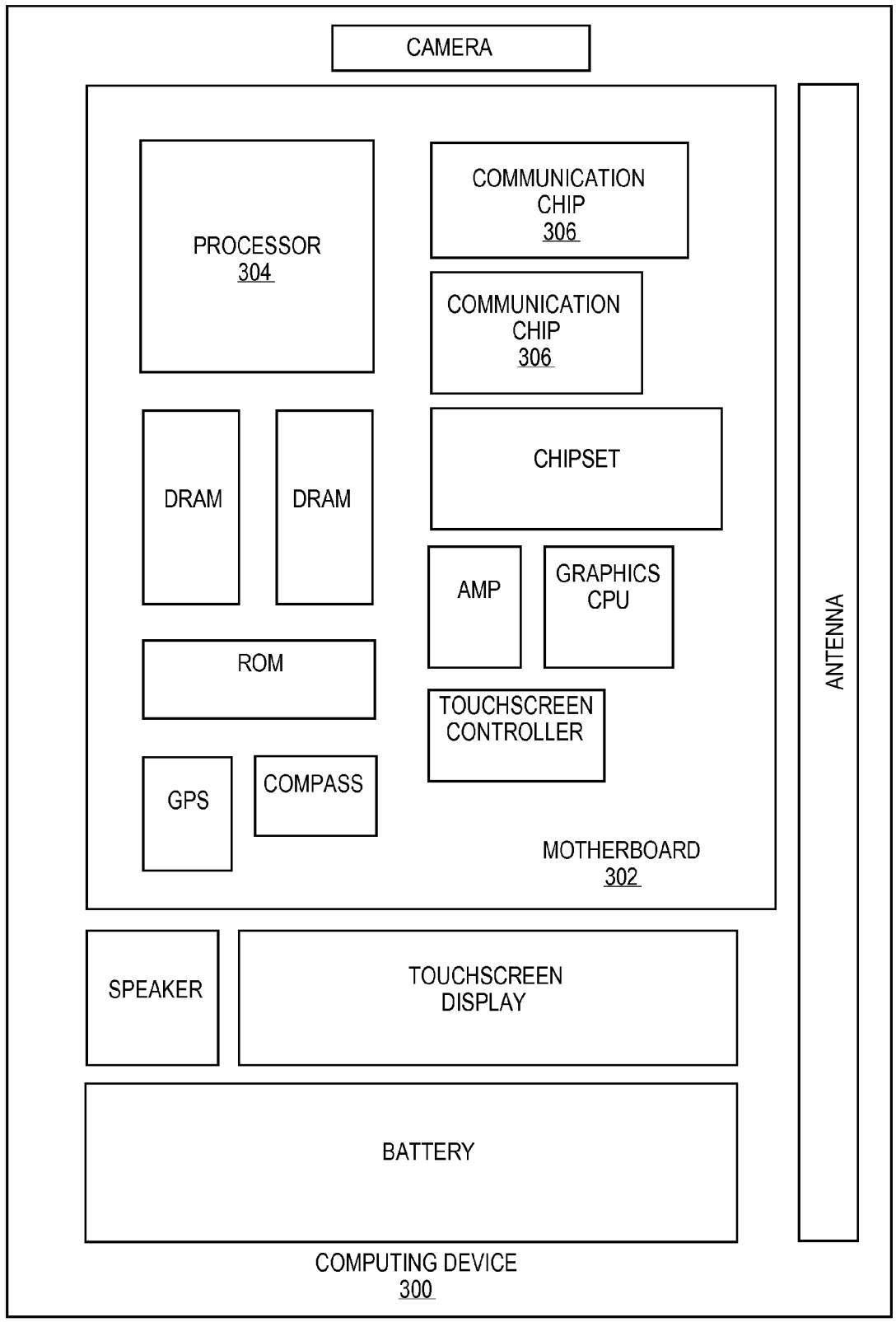
FIG. 6 illustrates a schematic illustration of a computing device.

FIG. 6 illustrates computing device 300 in accordance with one implementation. Computing device 300 houses board 302. Board 302 may include a number of components, including but not limited to processor 304 and at least one communication chip 306. Processor 304 is physically and electrically connected to board 302. In some implementations the at least one communication chip 306 is also physically and electrically connected to board 302. In further implementations, communication chip 306 is part of processor 304.

Depending on its applications, computing device 300 may include other components that may or may not be physically and electrically connected to board 302. These other components include, but are not limited to, volatile memory (e.g., DRAM), non-volatile memory (e.g., ROM), flash memory, a graphics processor, a digital signal processor, a crypto processor, a chipset, an antenna, a display, a touch screen display, a touch screen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communication chip 306 enables wireless communications for the transfer of data to and from computing device 300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communication chip 306 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. Computing device 300 may include a plurality of communication chips 1006. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

Processor 304 of computing device 300 includes an integrated circuit die packaged within processor 304. In some implementations, the integrated circuit die of the processor includes one or more devices, such as transistors or metal interconnects, that are formed in accordance with implementations described above where porous dielectric material is used as one or more layers of interlayer dielectric (ILD) and portions of a surface of a porous dielectric layer include a pore obstructing continuous or non-continuous (e.g., formed in distinct areas of a surface across one or more pores) film or skin. The term "processor" may refer to any device or portion of a device that processes electronic data from registers and/or memory to transform that electronic data into other electronic data that may be stored in registers and/or memory.

Communication chip 306 also includes an integrated circuit die packaged within communication chip 306. In accordance with another implementation, the integrated circuit die of the communication chip includes one or more devices, such as transistors or metal interconnects, that are formed in accordance with implementations described above where porous dielectric material is used as one or more layers of interlayer dielectric (ILD) and portions of a surface of a porous dielectric layer include a pore film or skin.

In further implementations, another component housed within the computing device 300 may contain an integrated circuit die that includes one or more devices, such as transistors or metal interconnects, that are formed in accordance with implementations described above where porous dielectric material is used as one or more layers of interlayer dielectric (ILD) and portions of a surface of a porous dielectric layer include a pore film or skin.

In various implementations, the computing device 300 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 300 may be any other electronic device that processes data.

In the description above, for the purposes of explanation, numerous specific details have been set forth in order to provide a thorough understanding of the embodiments. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", "one or more embodiments", or "different embodiments", for example, means that a particular feature may be included in the practice of the invention. Similarly, it should be appreciated that in the description various features are sometimes grouped together in a single embodiment, figure, or description thereof for the purpose of streamlining the disclosure and aiding in the understanding of various inventive aspects. This method of disclosure, however, is not to be interpreted as reflecting an intention that the invention requires more features than are expressly recited in each claim. Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A method comprising:
   forming a dielectric material comprising a surface porosity on a circuit substrate comprising a plurality of devices, a surface of the dielectric material comprising a surface in which a plurality of pores emanate therefrom;
   selectively chemically modifying a portion of the surface of the dielectric material with a hydrogen or oxygen plasma relative to the plurality of pores;
   reacting the chemically modified portion of the surface with a molecule that, once reacted, will be thermally stable; and
   forming a film comprising the molecule, wherein with the film, the surface porosity of the dielectric material is reduced,
   wherein forming the film comprises forming a film on the surface of the dielectric material and not in the pores.

2. The method of claim 1, wherein chemically modifying a portion of the surface of the dielectric material comprises rendering the portion more hydrophilic.

3. The method of claim 1, wherein chemically modifying a portion of the surface of the dielectric comprises forming silanol groups on the portion.

4. The method of claim 1, wherein forming the film comprises forming a polymer comprising the thermally stable molecule.

5. The method of claim 1, wherein the molecule comprises a carbosilane.

6. The method of claim 5, wherein the carbosilane is one of a chlorosilane, an aminosilane, or a hydridosilane.

7. The method of claim 1, wherein the circuit substrate comprises interconnect structures to ones of the plurality of devices and forming the dielectric material comprises forming the dielectric material on the interconnect structures.

8. A method comprising:
forming a dielectric material comprising a surface in which pores emanate therefrom on a circuit substrate comprising a plurality of devices;
selectively chemically modifying a portion of the surface of the dielectric material with a hydrogen or oxygen plasma relative to the plurality of pores;
reacting a thermally stable carbosilane with the chemically modified surface portion; and
forming a pore obstructing film on the chemically modified portion of the surface,
wherein forming the film comprises forming a film on the surface of the dielectric material and not in the pores.

9. The method of claim 8, wherein the carbosilane is a chlorosilane.

10. The method of claim 8, wherein the carbosilane is an aminosilane.

11. The method of claim 9, wherein the carbosilane is a hydridosilane.

12. The method of claim 8, wherein chemically modifying a portion of the surface of the dielectric comprises forming silanol groups on the portion.

13. The method of claim 8, wherein the circuit substrate comprises interconnect structures to ones of the plurality of devices and forming the dielectric material comprises forming the dielectric material on the interconnect structures.

14. An apparatus comprising:
a circuit substrate comprising a plurality of devices;
a plurality of interconnect lines disposed in a plurality of layers coupled to ones of the plurality of devices; and
a plurality of dielectric layers disposed between the plurality of interconnect lines,
wherein at least one of the dielectric layers comprises a porous material defining a base and a surface relative to the plurality of devices and the surface is more hydrophilic than the base and selectively comprises a pore obstructing material of a carbosilane thereon chemically reacted with a material of the at least one of the dielectric layers relative to pores emanating from the surface with the pore obstructing material not present in the emanating pores themselves.

15. The apparatus of claim 14, wherein the pore obstructing material is present in an amount to obstruct otherwise exposed pores in the surface.

16. The apparatus of claim 14, wherein the pore obstructing material is reacted with a surface of the porous material.

17. The apparatus of claim 14, wherein the pore obstructing material comprises a molecular structure including at lease one ring structure of carbon and silicon atoms.

18. The apparatus of claim 14, wherein the pore obstructing material is thermally stable at a temperature of 400 Celsius.

* * * * *